United States Patent
Zeiger

(10) Patent No.: US 6,278,277 B1
(45) Date of Patent: Aug. 21, 2001

(54) PROBE HEAD FOR NUCLEAR MAGNETIC RESONANCE MEASUREMENTS

(75) Inventor: Heinz Zeiger, Waldbronn (DE)

(73) Assignee: Bruker Analytik GmbH (DE)

( * ) Notice: Subject to any disclaimer, the term of this patent is extended or adjusted under 35 U.S.C. 154(b) by 0 days.

(21) Appl. No.: 09/357,524

(22) Filed: Jul. 19, 1999

(30) Foreign Application Priority Data

Jul. 24, 1998 (DE) ............................................. 198 33 350

(51) Int. Cl.[7] ...................................................... G01V 3/00
(52) U.S. Cl. ........................... 324/322; 324/318; 324/300
(58) Field of Search .................................... 324/322, 318, 324/300

(56) References Cited

U.S. PATENT DOCUMENTS

| | | | |
|---|---|---|---|
| 4,633,181 | 12/1986 | Murphy-Boesch et al. | 324/322 |
| 5,229,724 | 7/1993 | Zeiger | 324/322 |

FOREIGN PATENT DOCUMENTS

WO 92/17792  10/1992  (WO).

OTHER PUBLICATIONS

Jiang, et al., "An Efficient Double–Tuned +$^{13}$C/$^1$H Probe Circuit For CP/MAS NMR and Its Importance in Linewidths" Journal of Magnetic Resonance, vol. 71 (1987) pp. 485–494.

Primary Examiner—Christine Oda
Assistant Examiner—Brij B. Shrivastav
(74) Attorney, Agent, or Firm—Oppenheimer, Wolff & Donnelly LLP; Claude A. S. Hamrick

(57) ABSTRACT

A probe head is used for nuclear resonance measurements during which two different kinds of nuclei are excited by means of radio frequency irradiation in a constant magnetic field. The probe head is provided with a pick-up coil receiving a sample under investigation. The pick-up coil is connected to a first input for feeding a signal of higher frequency for exciting a first kind of nuclei and/or for receiving a resonance signal emitted by the first kind of nuclei. The pick-up coil, further, is connected to a second input for feeding a signal of a lower frequency for exciting a second kind of nuclei and/or for receiving a resonance signal emitted by the second kind of nuclei. The pick-up coil, moreover, is connected to a radio frequency line the electrical length of which corresponds to an integer multiple of a quarter of the wave length of the higher frequency. A series capacitor is interconnected between the radio frequency line and the pick-up coil.

26 Claims, 4 Drawing Sheets

PROBE HEAD FOR NUCLEAR MAGNETIC RESONANCE MEASUREMENTS

FIELD OF THE INVENTION

This invention relates to the field of magnetic resonance, in particular nuclear magnetic resonance measurements. More specifically, the invention is related to nuclear magnetic resonance measurements wherein at least two different kinds of nuclei are excited by means of radio frequency irradiation within a constant magnetic field.

BACKGROUND OF THE INVENTION

The invention relates to a probe head for nuclear magnetic resonance measurements comprising a pick-up coil cooperating with a sample under investigation. The pick-up coil is connected to a first input and to a second input. The first input is used for feeding a signal of a higher radio frequency ($f_H$) to the pick-up coil for exciting a first kind of nuclei, for example protons (H) and/or for receiving from the pick-up coil a resonance signal emitted by the nuclei of the first kind of nuclei (H). The second input is used for feeding a signal of a lower radio frequency ($f_X$) to the pick-up coil for exciting a second kind of nuclei (X) and/or for receiving from the pick-up coil a resonance signal emitted by the nuclei of the second kind of nuclei (X). A radio frequency line is also connected to the pick-up coil. The radio frequency line has an electrical length corresponding to an integer multiple of a quarter wave length ($\lambda/4$) of the higher radio frequency ($f_H$).

A probe head of the afore-mentioned kind is disclosed in U.S. Pat. No. 5,229,724 (Zeiger) assigned to the applicant of the present application.

Probe heads of the kind of interest in the present context are used for conducting nuclear double resonance experiments. In such experiments a first kind of nuclei, mostly protons ($^1H$) or fluorine ($^{19}F$) is excited and/or observed, whereas a second kind of nuclei is simultaneously excited and/or observed, for example certain isotopes of nitrogen ($^{15}N$) or phosphor ($^{31}P$) or carbon ($^{13}C$) or silicon ($^{29}Si$) or aluminum (27Al). In the art of magnetic resonance the first kind of nuclei is usually designated as "H" whereas the second kind of nuclei is identified as "X".

In modern high field nuclear magnetic resonance spectrometers, the exciting frequency for protons ($^1H$) is, for example, 800 MHz. In that case, the field strength of the constant magnetic field is about 18.8 Tesla. As is well-known in the art, the resonance frequency of nuclei and the magnetic field strength of the constant magnetic field are interrelated by a proportionality factor called the gyromagnetic ratio having an individual value for each kind of nuclei.

In the case specified before, i.e. always related to the same field strength of the magnetic field of 18.8 Tesla, the resonance frequency for the above-mentioned isotopes of nitrogen ($^{15}N$) is 81 MHz, of phosphor ($^{31}P$) is 324 MHz, of carbon ($^{13}C$) is 201 MHz, of silicon ($^{29}Si$) is 159 MHz and of aluminum ($^{27}Al$) is 208 MHz roughly.

The probe head according to U.S. Pat. No. 5,229,724 mentioned above is designed for a proton resonance frequency of 400 MHz. With a proton resonance frequency of 400 MHz, the resonance frequency of e.g. nitrogen ($^{15}N$) is only about 40.5 MHz. Therefore, the prior art probe head is designed for a frequency range of between 40 and 400 MHz.

The above-mentioned double resonance experiments are preferably conducted such that measurements are taken at X-frequency and decoupling is effected at H-frequency.

Probe heads for such experiments are designed such that the electric probe head network comprising the pick-up coil as well as the radio frequency line are optimized in their equivalent electrical circuit for the higher radio frequency, as seen from the first input and for the lower radio frequency, respectively, as viewed from the second input.

In the prior art probe head, a very broad frequency band may be swept on the X-side, i.e. on the lower radio frequency side, in contrast to still older prior art probe heads which had only been optimized for a very narrow frequency band on the X-side. In the probe head mentioned at the outset, one has attempted an optimization of between 40 MHz for $^{15}N$ up to 162 MHz for $^{31}P$. The X-frequencies, therefore, amount to between one tenth and one half of the H-frequency being 400 MHz.

In the prior art probe head, the radio frequency line coupled to the pick-up coil is configured as a $\lambda/2$ line (related to the H-frequency of e.g. 400 MHz). At about one half of the $\lambda/2$ line, there is a switchable bridge so that the radio frequency line may be operated with its entire length ($\lambda/2$) when the bridge is open and at half length ($\lambda/4$) when the bridge is closed.

In the first case of the $\lambda/2$ line one has, therefore, an equivalent electrical circuit as viewed from the X-side in which the pick-up coil is terminated by a capacitance at its terminal end facing away from the X input (the second input). This results in a high pass characteristic in which the pick-up coil has a low resistive load for current of high frequency whereas, corresponding to the size of the capacitor, a lower threshold frequency has to be taken into account.

If, however, the bridge is closed and in the electrical equivalent circuit (again viewed from the X-side), the pick-up coil is terminated at its output by an inductivity so that in this situation the pick-up coil has a low resistive load for current of low frequency and, depending on the size of the inductivity, an upper threshold frequency may be determined.

Moreover, with the prior art probe head the electrical bridge must remain open for high X-frequencies (e.g. $^{31}P$) whereas it is closed for lower X-frequencies (e.g. $^{15}N$).

A disadvantage of the prior art probe head, when operated as a $\lambda/4$ line (as well as with other prior art probe heads utilizing a $\lambda/4$ line) the circuitry of the pick-up coil is asymmetric because the value of the radio frequency voltage at one terminal end of the pick-up coil is very high, whereas it is very low at the opposite end of the pick-up coil. This is highly disadvantageous in particular for high measuring frequencies.

Still another disadvantage of the prior art probe head, again when operated as a $\lambda/4$ line, is that the filling factor of the entire inductivity is not optimized because only a portion of the resonant circuit inductivity is filled with sample volume. This portion of the inductivity of the resonant circuit configured by the $\lambda/4$ line will be larger, the higher the X-frequency is. For that reason measurements at high X-frequencies are difficult so that supplemental tricks must be used, for example another inductivity switched in parallel to the pick-up coil.

Further probe heads of the kind of interest in the present context are disclosed in an article by Jiang, "An Efficient Double-Tuned $^{13}C/^1H$ Probe Circuit for CP/MAS NMR and Its Importance in Linewidths", JOURNAL OF MAGNETIC RESONANCE, 71, 1987, pages 485–494, in U.S. Pat. No. 4,633,181 and in published PCT patent application WO 92/17792.

It is, therefore, an object underlying the present invention to improve a probe head of the kind mentioned at the outset such that improved measurements may be made at X-frequencies having up to one half the value of the H-frequency. Still another object is to enable improved measurements on very lossy samples which normally negatively affect the resonance frequency and the quality of the resonant circuit.

SUMMARY OF THE INVENTION

These and other objects underlying the invention are solved by a probe head as specified above which, additionally, has a series capacitor being interconnected between the radio frequency line and the pick-up coil. The radio frequency line is preferably a $\lambda/4$ line.

The object underlying the invention is thus entirely solved.

By providing a series capacitor between the radio frequency line and the pick-up coil one can, as compared with prior art probe head circuits utilizing short-circuited $\lambda/4$ lines, avoids the portion of the inductivity within that $\lambda/4$ line by setting a "push-pull"-operation at the pick-up coil in which operation the radio frequency voltage at opposite ends of the pick-up coil has opposite polarity. As compared with prior art probe head circuits utilizing a $\lambda/2$ line, the load capacity at the end of the open $\lambda/2$ line is mostly avoided. Seen as a whole, the provision of a series capacitor makes it possible to utilize the probe head for X-frequencies up to the order of one half the H-frequency.

The series capacitor may be dimensioned very small, e.g. between 3 and 6 pF. When doing so, higher X-frequencies may be utilized as compared with the prior art. In particular, the upper threshold value according to which the X-frequency may, at a maximum, have half the value of the H-frequency (of. U.S. Pat. No. 5,229,724), is no more existent.

As already mentioned, it is preferred within the scope of the present invention to dimension the series capacitor such that a radio frequency voltage of the lower radio frequency has opposite polarity at terminal ends of the pick-up coil.

The "push-pull"-operation of the pick-up coil being a consequence of a so-dimensioned series capacitor results in a lower mistuning of the resonant circuit and in a lower reduction of the quality factor, in particular when lossy samples are investigated. The relatively large capacity of the series capacitor (as compared to the high H-frequency) affects the operation on the H-side only marginally. These effects may, further, be mostly compensated for by slightly adjusting the tuning for the H-frequency. This may, for example, be effected by varying the line length of the $\lambda/4$ line accordingly.

In a further preferred embodiment of the invention, the series capacitor is adapted to be bridged.

This feature has the advantage that the probe head measuring range may be broadened towards lower X-frequencies by simply bridging the capacitor.

The invention may be utilized advantageously in high field nuclear magnetic resonance spectrometers having a constant magnetic field with a field strength in excess of 9 Tesla. If, for example, the magnetic field has a field strength of 18.8 Tesla, the resonance frequency of protons is about 800 MHz, as already mentioned, and the resonance frequency of phosphor ($^{31}$P) is about 324 MHz. It is, therefore, in the order of one half of the proton resonance frequency.

In another preferred embodiment of the invention, the constant magnetic field has a strength of 11.8 Tesla. In that case, measurements may be effected on the H-side while de-coupling phosphor ($^{31}$P) at about 202 MHz, whereas the measuring frequency for silicon ($^{29}$Si) is about 99 MHz and for aluminum ($^{27}$Al) is about 132 MHz.

Still another distinct advantage may be obtained when the probe head of the present invention is used for so-called MAS-measurements in which the sample is rotated under the so-called "magic" angle of 54° 44' with respect to the direction of the constant magnetic field.

Further advantages of the invention will become apparent from the description and the enclosed drawing.

It goes without saying that the features mentioned above and those that will be recited hereinafter may not only be used in the particularly given combination but also in other combinations without leaving the scope of the present invention.

BRIEF DESCRIPTION OF THE DRAWINGS

Embodiments of the invention are shown in the annexed drawing and will be described in further detail in the subsequent description.

DETAILED DESCRIPTION OF THE PREFERRED EMBODIMENTS

Nuclear magnetic resonance probe heads for carrying out double resonance experiments are well-known in the prior art. An extensive description of such probe heads may, for example, be found in U.S. Pat. No. 5,229,724, the contents of which is incorporated herein by way of reference.

Figure 1:
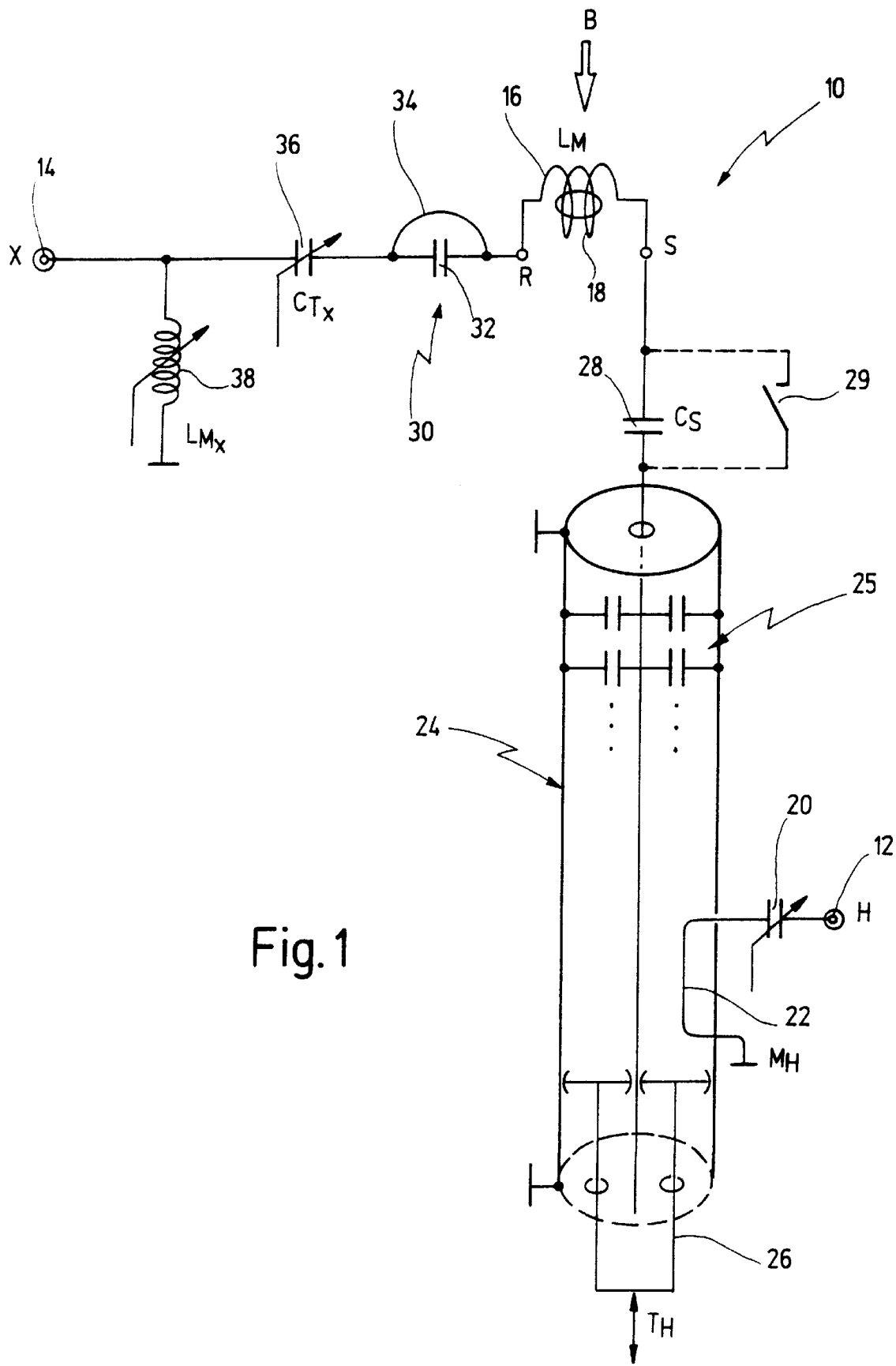
FIG. 1 shows a circuit diagram of a first embodiment of a probe head according to the invention.

In FIG. 1, reference numeral 10 as a whole designates a probe head for nuclear magnetic resonance measurements and adapted to carry out double resonance experiments. The kind of nuclei to be observed is normally the one with the lower frequency ($^{15}$N, $^{31}$P, $^{13}$C, $^{29}$Si or $^{27}$Al), whereas the other kind of nuclei at a higher frequency ($^1$H or $^{31}$P) is decoupled simultaneously. The measuring frequency is hereinafter designated by "X" and the decoupling frequency by "H".

Probe head 10 has a first input 12 for the decoupling frequency and a second input 14 for the measuring frequency. The pick-up coil having an inductivity $L_M$ is designated by reference numeral 16. Pick-up coil 16 encloses sample 18. R and S are the terminal ends of the pick-up coil 16.

From input 12 a tunable capacitor 20 is directed to a coupling loop 22 being arranged at a $\lambda/4$ line 24. The designation "$\lambda$" is related to the wave length of the decoupling signal H. The length of $\lambda/4$ line 24 may be adjusted by means of a shorting plunger 26, as indicated by an arrow $T_H$. Line 24 has a capacitance per unit length, as indicated at 25. With usual lines 24, the capacitance 25 per unit length is in the order of 0.5 pF/cm line length.

From the terminal end of $\lambda/4$ line 24 facing away from shorting plunger 26, a series capacitor 28 having a capacity $C_S$ leads to terminal end S of pick-up coil 16. The opposite terminal end R of pick-up coil 16 is connected to a wave trap 30 consisting of a capacitor 32 and a parallel wire bridge 34 of predetermined inductivity. Wave trap 30 protects the X-side by rejecting decoupling signals H.

In a modified embodiment series capacitor 28 may be bridged by means of a switch 29. However, in that case one has to take special precautions because then series capacitor 28 is then radio frequency wise "hot" against ground.

Wave trap 30 leads to a tunable capacitor 36 having a capacity $C_{Tx}$, the opposite side of which being in turn connected with second input 14. Second input 14, further, is connected to ground via a tunable inductor 38 of inductivity $L_{Mx}$.

Probe head 10 shown in FIG. 1, therefore, distinguishes from the prior art probe head according to U.S. Pat. No. 5,229,724 (FIG. 4) in that line 24 is a λ/4 line and a series capacitor 28 is provided between line 24 and pick-up coil 16. The capacity $C_S$ of series capacitor 28 is significantly lower as compared with equivalent capacity 49 shown in FIG. 2C of U.S. Pat. No. 5,229,724 because equivalent capacity 49 is highly predetermined by the capacity of the line section of the λ/2 line being in the order of about 0.5 pF/cm. Due to the low value of $C_S$, significantly higher X-frequencies may be reached as compared with that of prior art.

Figure 2A:
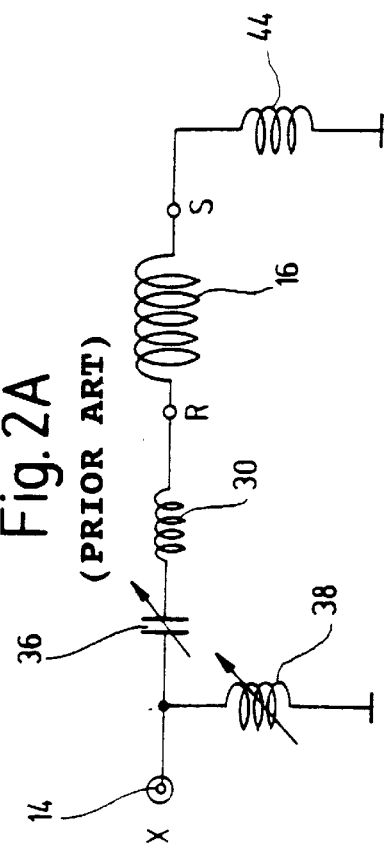
FIGS. 2A and 2B show an equivalent electrical circuit as well as a voltage graph for a probe head of the prior art.

FIG. 2A shows an equivalent electrical circuit of a conventional probe head having no such series capacitor 28. The equivalent electrical circuit of FIG. 2A, when viewed from the X-side, shows an equivalent inductance 44 behind terminal end S of pick-up coil 16.

Figure 2B:
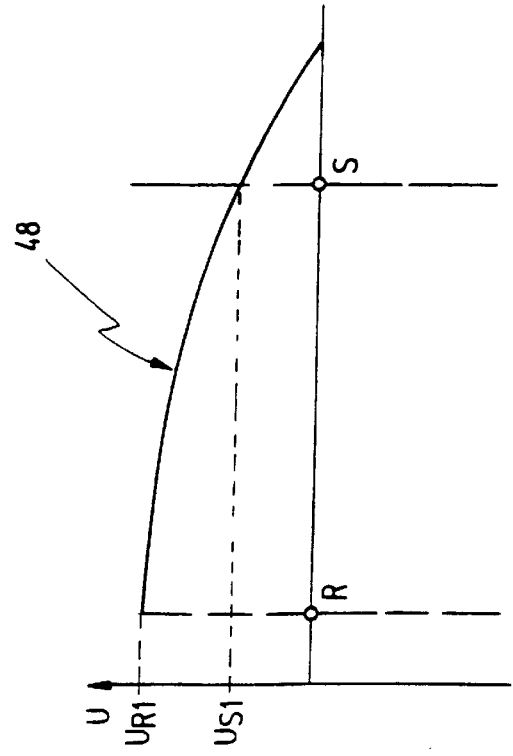

Considering now in FIG. 2B a voltage graph 48 over pick-up coil 16, i.e. between terminal ends R and S, one can clearly see the asymmetrical character of the equivalent electrical circuit of FIG. 2A. The radio frequency voltage values $U_{R1}$ and $U_{S1}$ at the terminal ends of pick-up coil 16 have the same polarity and the higher voltage $U_{R1}$ appears at terminal end R.

Figure 3A:
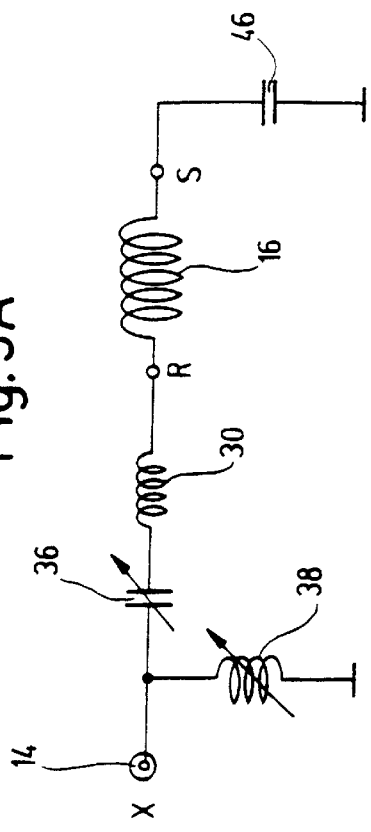
FIGS. 3a and 3B show depictions, similar to those of FIGS. 2A and 2B, however, for the probe head of FIG. 1.

If, in FIG. 3A, we now compare the corresponding equivalent electrical circuit of a probe head 10 according to the invention as shown in FIG. 1, one can see an equivalent capacity 46 behind terminal end S of pick-up coil 16, as viewed from the X-side.

Figure 3B:
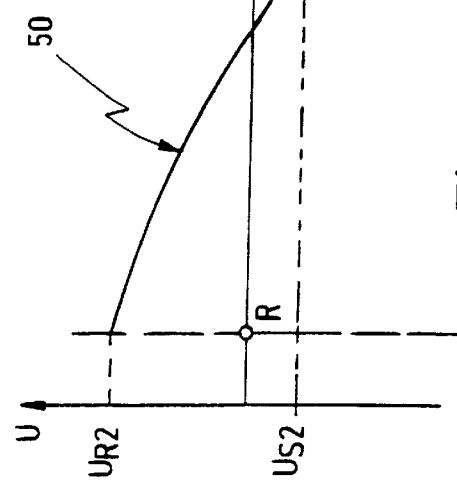

A corresponding voltage graph 50 is depicted in FIG. 3B. One can clearly see that we now have a symmetrical system. The values of radio frequency voltage $U_{R2}$ and $U_{S2}$ at the terminal ends R and S now have opposite polarity and the absolute voltage values are lower.

As compared with the prior art, the series capacitor 28, therefore, increases the upper frequency threshold on the X-side while maintaining the same range of variation of tunable capacitor 36, however, it also shifts the lower frequency threshold towards higher frequencies.

Turning now to the selection of the capacitance value of series capacitor 28 which may be 6 pF for a H-frequency of 400 MHz, one has to take into account that a tuning of the H-side must be possible, for example by setting the length of line 24 somewhat differently.

For a comparative consideration on the X-side one may start from some electrical characteristics, namely inductivity $L_M$ of pick-up coil 16, measuring frequency $f_x$, a preselected capacitance value $C_{Tx}$ of adjustable capacitor 36 and its minimum value, respectively.

If, as compared with the prior art, one maintains the inductivity $L_M$ of pick-up coil 16 as well as operating frequency $f_x$, the voltage amplitude at terminal end R of pick-up coil 16 according to the invention is smaller as compared with the prior art (FIG. 3B) due to the prevailing push-pull operation. Accordingly, the tunable capacitor 36 has a lower voltage load. Moreover, the de-tuning of the resonance circuit for different sample materials, i.e. for sample materials with different losses, is lower. Finally, the radio frequency losses are lower, too, in particular for sample materials having high radio frequency losses anyway.

If, on the other hand side, one maintains the preselected capacitance value $C_{Tx}$ of tunable capacitor 36 as well as the corresponding measuring frequency $f_x$, one gets a higher inductivity of pick-up coil 16, as compared with the prior art, and, hence, the possibility of using a push-pull operation. With the same pick-up coil length a higher winding density is possible which, in turn, enables the use of higher excitation magnetic field strengths $B_1$ and yields a better signal-to-noise ratio during the recording of nuclear signals. Finally, a greater pick-up coil length and/or a higher winding density yields a higher homogeneity within pick-up coil 16.

If, finally, one maintains the inductivity $L_M$ of pick-up coil 16 and a minimum capacitance value $C_{TX}$ of the tunable capacitor, one obtains a higher resonance frequency on the X-side as compared with the prior art. If the capacitance value $C_S$ of series capacitor 28 is selected cleverly, measurements are possible in which the measuring frequency $f_X$ may be higher than half the decoupling frequency $f_H$.

Figure 4:
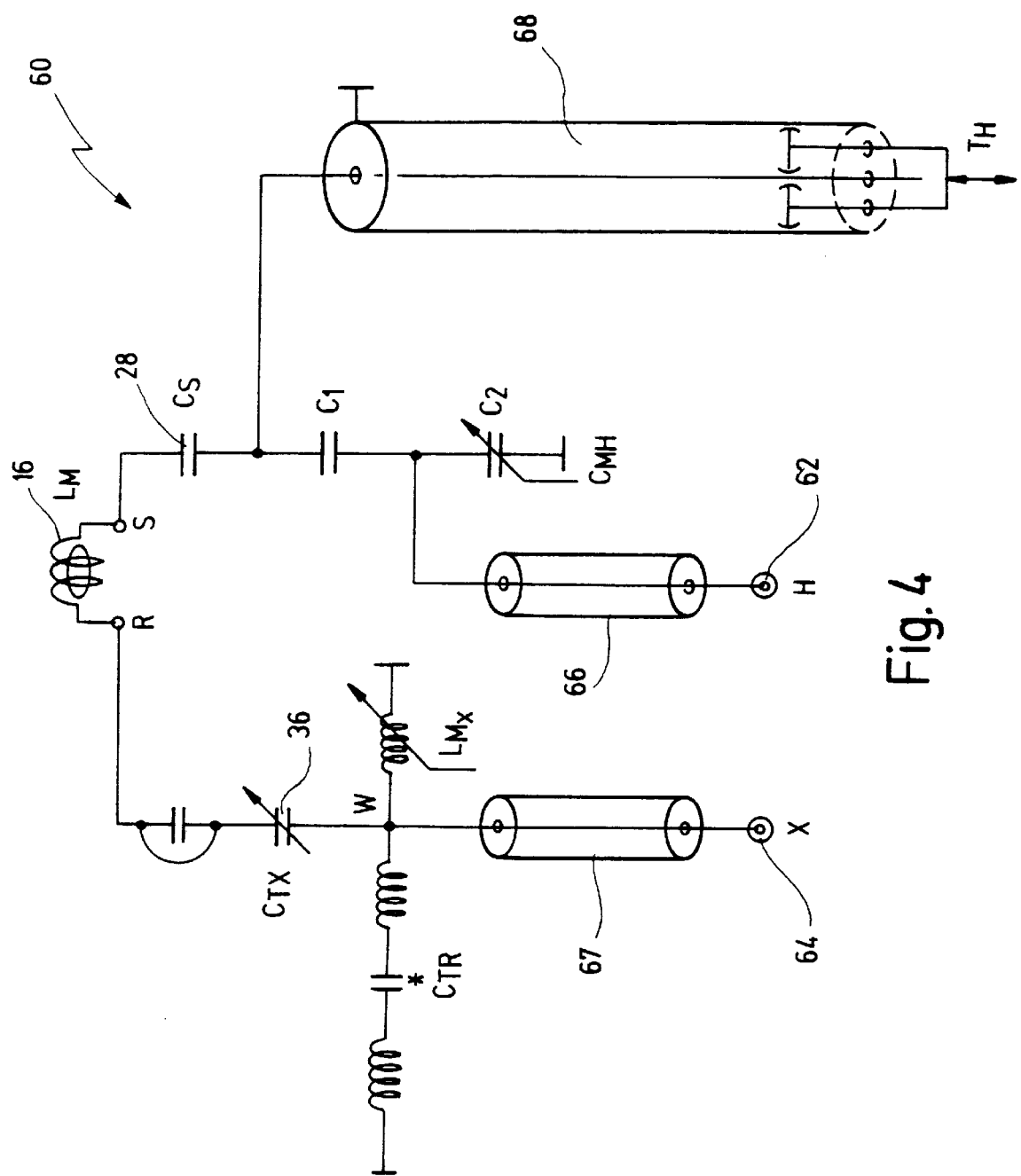
FIG. 4 shows a circuit diagram of a second embodiment of a probe head according to the invention.

FIG. 4 shows a further embodiment of a probe head 10 according to the invention. Probe head 10 comprises a first input 62 on the H-side as well as a second input 64 on the X-side. Inputs 62, 64 are coupled to lines 66 and 67, respectively.

As one can take from FIG. 4, we have an inductive coupling on the X-side and a capacitive coupling on the H-side.

For a measuring frequency $f_X$=323.9 MHz and a decoupling frequency $f_H$=800.1 MHz, a pick-up coil 16 was designed with several windings of a wire having 0.5 mm diameter. The pick-up coil length was 6 mm and the inner pick-up coil diameter was 2.8 mm. The capacitance value $C_S$ of series capacitor 28 was 3.4 pF. The capacitive voltage divider $C_1/C_2$ behind line 66 was configured with capacitors having capacitance values $C_1$=0.3 pF and $C_2$ =1.5 through 25 pF. The capacitance value $C_{TX}$ of tunable capacitor 36 was between 1 and 10 pF.

At point W shown in FIG. 4 at the output of line 67, a capacitor $C_{TR}$ of 2.7 pF was installed and, together with its feeding wires (which in the depiction of FIG. 4 are shown as inductors on the left hand side and the right hand side of this capacitor) was tuned to 800 MHz. By doing so, signal portions H at frequency $f_H$ at second input X coming from first input 62 were attenuated.

In a practical test with probe head 60 of FIG. 4, a magic angle spinning (MAS) probe head having a 2.5 mm rotor was used. The probe head was located in a small bore magnet at a field strength of 18.79 Tesla. The measuring frequency $f_X$ was 323.85 MHz for isotope $^{31}$P, whereas protons were decoupled at $f_H$=800.1 MHz.

Figure 5:
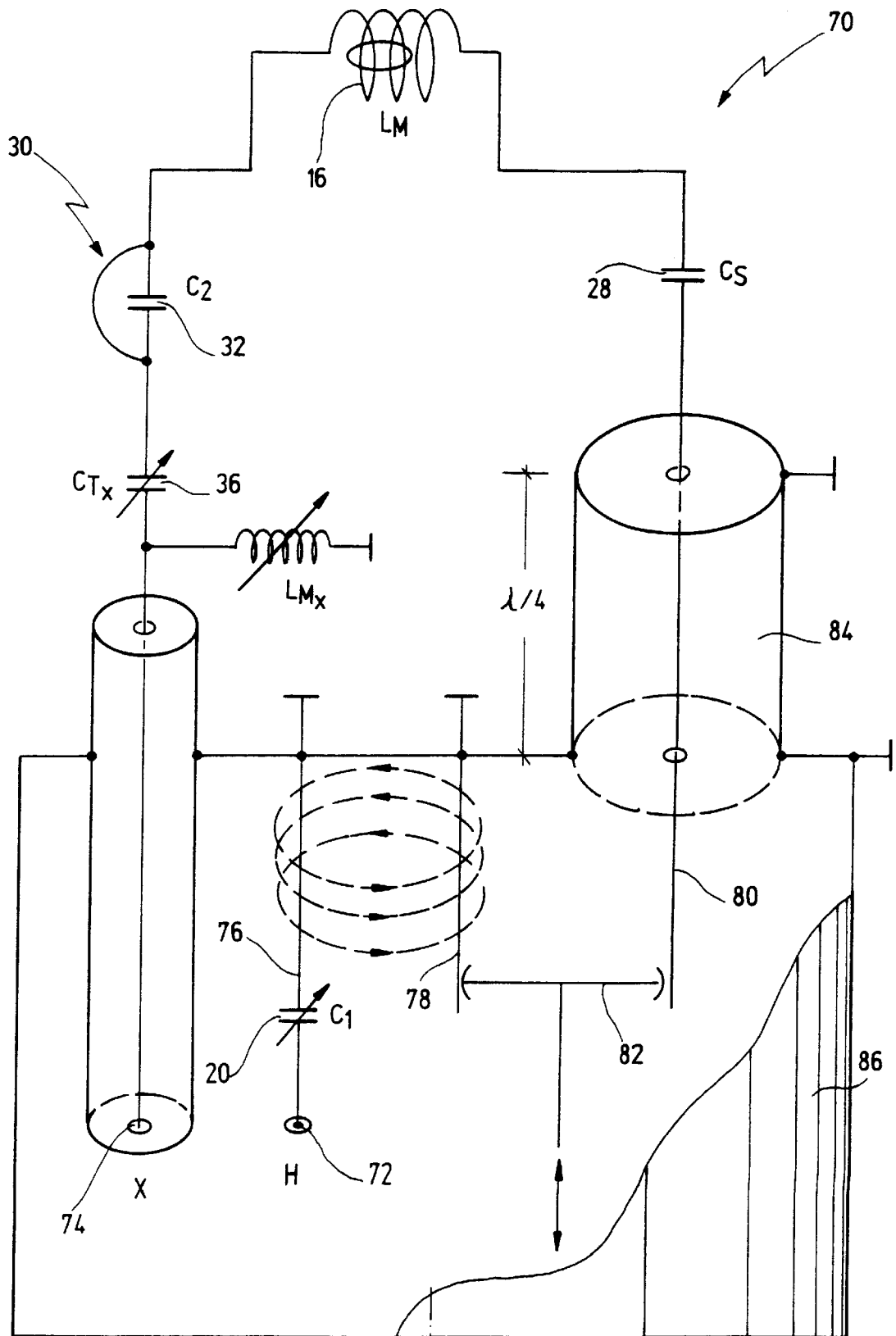
FIG. 5 shows a circuit diagram of a third embodiment of a probe head according to the invention.

FIG. 5 shows a third embodiment of a probe head 70 according to the invention having inputs 72 (H) and 74 (X). On the H-side, the decoupling signal H is fed via three line sections 76, 78 and 80. There exists an inductive coupling between the first line sections 76 and 78, whereas line sections 78 and 80 are interconnected by means of a shorting plunger 82.

The third line section 80 at the same time is the inner conductor of a λ/4 line 84.

Inputs 72, 74 together with their associated lines and line sections are altogether located within a conductive tube 86 enclosing the afore-mentioned elements and being grounded at its outside.

In probe head 70 there is an inductive coupling on the H-side via line sections 76, 78 and 80. There is also an inductive coupling on the X-side via an inductivity $L_{MX}$.

In probe head 70 pick-up coil 16 consists of thirteen windings of a wire of 0.5 mm diameter. The pick-up coil length is 9.6 mm and the inner pick-up coil diameter is 4.4 mm.

In that case the series capacitor 28 has a capacitance value $C_S$ of 5.5 pF. The value $C_1$ of adjustable capacitor 20 at the H-input is between 1 and 10 pF. The value $C_2$ of capacitor 32 within wave trap 30 is 25 pF. The capacitance $C_{TX}$ of tunable capacitor 36 can be varied between 1.5 and 52 pF.

MAS measurements utilizing rotors of 4 mm diameter were also conducted with probe head 70 of FIG. 5. The field strength of magnetic field B was 11.74 Tesla in a wide bore magnet. The measuring frequency $f_X$ was 99 and 132 MHz for isotopes $^{29}$Si and $^{27}$Al, respectively. Decoupling took place on the frequency of isotope $^{31}$P namely $f_H$=202.4 MHz.

What is claimed is:

1. A probe head for nuclear magnetic resonance measurements, wherein at least two different kinds of nuclei are excited by means of radio frequency irradiation within a constant magnetic field, the probe head comprising:
 a pick-up coil cooperating with a sample,
  said pick-up coil being connected to a first input for feeding a signal of a higher radio frequency to said pick-up coil for exciting a first kind of nuclei and/or for receiving from said pick-up coil a resonance signal emitted by said nuclei of said first kind of nuclei,
  said coil being, further, connected to a second input for feeding a signal of a lower radio frequency to said pick-up coil for exciting a second kind of nuclei and/or for receiving from said pick-up coil a resonance signal emitted by said nuclei of said second kind of nuclei,
 a radio frequency line being also connected to said pick-up coil, said radio frequency line having an electrical length corresponding to an integer multiple of a quarter wave length of said higher radio frequency; and
 a series capacitor being interconnected between said radio frequency line and said pick-up coil.

2. The probe head of claim 1, wherein said radio frequency line is a $\lambda/4$ line.

3. The probe head of claim 1, wherein said series capacitor is adapted to be bridged.

4. The probe head of claim 1, wherein said constant magnetic field has a field strength in excess of 9 Tesla.

5. The probe head of claim 1, wherein said constant magnetic field has a direction and said sample is rotated under an angle of 54° 44' relative to said direction.

6. A probe head for nuclear magnetic resonance measurements, wherein at least two different kinds of nuclei are excited by means of radio frequency irradiation within a constant magnetic field, the probe head comprising;
 a pick-up coil cooperating with a sample,
  said pick-up coil being connected to a first input for receiving a signal of a first radio frequency and operative to excite a first kind of nuclei, and/or for receiving a resonance signal emitted by said nuclei of said first kind of nuclei,
  said pick-up coil being further connected to a second input for receiving a signal of a second radio frequency lower than said first radio frequency and operative to excite a second kind of nuclei, and/or for receiving a resonance signal emitted by said nuclei of said second kind of nuclei,
 a radio frequency line connected to said pick-up coil, said radio frequency line having an electrical length corresponding to an integer multiple of a quarter wave length of said first radio frequency; and a series capacitor interconnected between said radio frequency line and said pick-up coil, said series capacitor being dimensioned such that a radio frequency voltage of said second radio frequency has opposite polarity at terminal ends of said pick-up coil.

7. The probe head of claim 6, wherein said radio frequency line is a $\lambda/4$ line.

8. The probe head of claim 6, wherein said series capacitor is adapted to be bridged.

9. The probe head of claim 6, wherein said probe head and said sample are adapted to be positioned within a constant magnetic field having a field strength in excess of 9 Tesla.

10. The probe head of claim 6, wherein said probe head and said sample are adapted to be positioned within a constant magnetic field having a predetermined direction, and wherein said sample is rotated under an angle of 54° 44' relative to said direction.

11. A probe head for nuclear magnetic resonance measurements, wherein at least two different kinds of nuclei are excited by means of radio frequency irradiation within a constant magnetic field, the probe head comprising:
 a pick-up coil cooperating with a sample,
  said pick-up coil being connected to a first input for receiving a signal of a first radio frequency and operative to excite a first kind of nuclei, and/or for receiving a resonance signal emitted by said nuclei of said first kind of nuclei, wherein said first kind of nuclei is protons ($^1$H), and having a first resonance frequency proportional to a predetermined magnetic field strength, wherein at a constant magnetic field of 13.8 Tesla field strength, said first resonance frequency is about 800 MHz,
  said pick-up coil being further connected to a second input for receiving a signal of a second radio frequency lower than said first radio frequency and operative to excite a second kind of nuclei, and/or for receiving a resonance signal emitted by said nuclei of said second kind of nuclei, wherein said second kind of nuclei is phosphor ($^{31}$P) and has a second resonance frequency proportional to said predetermined magnetic field strength, and wherein said second resonance frequency is about 324 MHz,
 a radio frequency line connected to said pick-up coil, said radio frequency line having an electrical length corresponding to an integer multiple of a quarter wave length of said first radio frequency; and
 a series capacitor interconnected between said radio frequency line and said pick-up coil.

12. The probe head of claim 11, wherein said series capacitor is dimensioned such that a radio frequency voltage of said second radio frequency has opposite polarity at terminal ends of said pick-up coil.

13. The probe head of claim 11 wherein said radio frequency line is a $\lambda/4$ line.

14. The probe head of claim 11, wherein said series capacitor is adapted to be bridged.

15. The probe head of claim 11, wherein said probe head and said sample are adapted to be positional within a constant magnetic field having a predetermined direction, and wherein said sample is rotated under an angle of 54° 44' relative to said direction.

16. A probe head for nuclear magnetic resonance measurements, wherein at least two different kinds of nuclei are excited by means of radio frequency irradiation within a constant magnetic field, the probe head comprising:

a pick-up coil cooperating with a sample, a first input for feeding a signal of a first radio frequency to said pick-up coil for exciting a first kind of nuclei, and/or for receiving from said pick-up coil a resonance signal emitted by said nuclei of said first kind of nuclei, wherein said first kind of nuclei is phosphor ($^{31}$P) and has a first resonance frequency proportional to a predetermined magnetic field strength, wherein at a constant magnetic field of 11.8 Tesla field strength, said first resonance frequency is about 202 MHz, a second input for feeding a signal of a second radio frequency to said pick-up coil for exciting a second kind of nuclei, and/or for receiving from said pick-up coil a resonance signal emitted by said nuclei of said second kind of nuclei wherein said second kind of nuclei is silicon ($^{29}$Si) and has a second resonance frequency proportional to said predetermined magnetic field strength, and wherein said second resonance frequency is about 99 MHz, a radio frequency line also connected to said pick-up coil, said radio frequency line having an electrical length corresponding to an integer multiple of a quarter wave length of said first radio frequency; and a series capacitor interconnected between said radio frequency line and said pick-up coil.

17. The probe head of claim 16, wherein said series capacitor is dimensioned such that a radio frequency voltage of said second radio frequency has opposite polarity at terminal ends of said pick-up coil.

18. The probe head of claim 16, wherein said radio frequency line is a $\lambda$/4 line.

19. The probe head of claim 16, wherein said series capacitor is adapted to be bridged.

20. The probe head of claim 16, wherein said constant magnetic field has a predetermined direction and said sample is rotated within said field under an angle of 54° 44' relative to said direction.

21. The probe head of claim 16, wherein said series capacitor is dimensioned such that a radio frequency voltage of said second radio frequency has opposite polarity at terminal ends of said pick-up coil.

22. A probe head for nuclear magnetic resonance measurements, wherein at least two different kinds of nuclei are excited by means of radio frequency irradiation within a constant magnetic field, the probe head comprising:

a pick-up coil cooperating with a sample, said pick-up coil being connected to a first input used for feeding a signal of a first radio frequency to said pick-up coil for exciting a first kind of nuclei, and/or for receiving from said pick-up coil a resonance signal emitted by said nuclei of said first kind of nuclei, wherein said first kind of nuclei is phosphor ($^{31}$P) and has a first resonance frequency proportional to a predetermined magnetic field strength, and wherein at a constant magnetic field of 11.8 Tesla field strength, said first resonance frequency is about 202 MHz, said pick-up coil being further connected to a second input used for feeding a signal of a second radio frequency lower than said first radio frequency to said pick-up coil for exciting a second kind of nuclei, and/or for receiving from said pick-up coil a resonance signal emitted by said nuclei of said second kind of nuclei, wherein said second kind of nuclei is aluminum ($^{27}$Al) and has a second resonance frequency proportional to said predetermined magnetic field strength, and wherein said second resonance frequency is about 122 MHz, a radio frequency line also connected to said pick-up coil, said radio frequency line having an electrical length corresponding to an integer multiple of a quarter wave length of said higher radio frequency; and a series capacitor interconnected between said radio frequency line and said pick-up coil.

23. The probe head of claim 22, wherein said radio frequency line is a $\lambda$/4 line.

24. The probe head of claim 22, wherein said series capacitor is adapted to be bridged.

25. The probe head of claim 22, wherein said constant magnetic field has a predetermined direction and said sample is rotated within said field under an angle of 54° 44' relative to said direction.

26. A probe head for nuclear magnetic resonance measurements, wherein at least two different kinds of nuclei are excited by means of radio frequency irradiation within a constant magnetic field, the probe head comprising:

a pick-up coil cooperating with a sample, said constant magnetic field having a predetermined direction and said sample being rotated within said field under an angle of 54° 44' relative to said direction, said pick-up coil being connected to a first input used for feeding a signal of a first radio frequency to said pick-up coil for exciting a first kind of nuclei, and/or for receiving from said pick-up coil a resonance signal emitted by said nuclei of said first kind of nuclei, said coil being further connected to a second input used for feeding a signal of a second radio frequency lower than said first radio frequency to said pick-up coil for exciting a second kind of nuclei, and/or for receiving from said pick-up coil a resonance signal emitted by said nuclei of said second kind of nuclei, a radio frequency line connected to said pick-up coil, said radio frequency line having an electrical length corresponding to an integer multiple of a quarter wave length of said first radio frequency; and a series capacitor interconnected between said radio frequency line and said pick-up coil.

* * * * *